United States Patent
Goeppert et al.

(10) Patent No.: US 12,550,424 B2
(45) Date of Patent: Feb. 10, 2026

(54) CASCODE ARRANGEMENT AND SEMICONDUCTOR MODULE

(71) Applicant: Robert Bosch GmbH, Stuttgart (DE)

(72) Inventors: Josef Goeppert, Kusterdingen (DE); Karl Oberdieck, Neckartenzlingen (DE); Manuel Riefer, Reutlingen (DE); Neil Davies, Sonnenbuehl-Genkingen (DE); Alexander Sewergin, Pfullingen (DE); Philipp Mueller, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 429 days.

(21) Appl. No.: 18/329,550

(22) Filed: Jun. 5, 2023

(65) Prior Publication Data
US 2024/0021610 A1  Jan. 18, 2024

(30) Foreign Application Priority Data
Jun. 7, 2022  (DE) ...................... 10 2022 205 737.6

(51) Int. Cl.
| | |
|---|---|
| *H10D 84/83* | (2025.01) |
| *H10D 30/60* | (2025.01) |
| *H10D 62/832* | (2025.01) |
| *H10D 64/23* | (2025.01) |
| *H10D 64/27* | (2025.01) |
| *H10D 84/80* | (2025.01) |

(52) U.S. Cl.
CPC .......... *H10D 84/83* (2025.01); *H10D 30/615* (2025.01); *H10D 62/8325* (2025.01); *H10D 64/256* (2025.01); *H10D 64/512* (2025.01); *H10D 84/811* (2025.01)

(58) Field of Classification Search
CPC .. H10D 84/83; H10D 30/615; H10D 62/8325; H01L 25/16; H01L 25/18; H03K 17/102
See application file for complete search history.

(56) References Cited

U.S. PATENT DOCUMENTS

| | | | |
|---|---|---|---|
| 2015/0200662 A1* | 7/2015 | Bhalla | H10D 84/035 257/262 |
| 2020/0126962 A1 | 4/2020 | Kono | |

* cited by examiner

*Primary Examiner* — Wasiul Haider
(74) *Attorney, Agent, or Firm* — Norton Rose Fulbright US LLP

(57) ABSTRACT

A cascade arrangement and to a semiconductor module. The cascode arrangement includes: a substrate, a JFET, a MOSFET, and at least one sensor system. A drain terminal of the MOSFET is electrically connected to a source terminal of the JFET and a source terminal of the MOSFET is electrically connected to a gate terminal of the JFET. A first semiconductor layer in which the MOSFET is formed and a second semiconductor layer in which the JFET is formed, are situated stacked on top of one another via a connecting material. Both an electrical and a thermal coupling between the JFET and the MOSFET are implemented via the connecting material. The stacked semiconductor layers are situated on the substrate. The first semiconductor layer includes a first subarea in which the MOSFET is formed and at least one second subarea in which the at least one sensor system is formed.

10 Claims, 2 Drawing Sheets

CASCODE ARRANGEMENT AND SEMICONDUCTOR MODULE

FIELD

The present invention relates to a cascode arrangement and to a semiconductor module including a plurality of such cascode arrangements.

BACKGROUND INFORMATION

To ensure a correct functioning of power electronic systems, it is conventional to detect and to monitor during the operation of such systems operating points and states of power semiconductors, which are situated in such systems.

For this purpose, it is possible to use discrete temperature sensors and current sensors, as well as to carry out measurements of currents and temperatures with the aid of parasitic effects and/or with the aid of structures integrated into the semiconductors. Examples of discrete current sensors are, among other things, Hall sensors or shunts. Temperatures may be measured, for example, on the basis of an NTC, of a PTC, of a PT1000 or of a thermocouple. Known measurements with the aid of parasitic effects are, for example, temperature measurements across voltages at the P-N junction, as well as measurements with the aid of delay times and measurement of internal gate resistances.

In addition, minimal conduction losses and switching losses of power semiconductors are called for due to efficiency requirements, in particular in the field of electric mobility. In order to satisfy these requirements, semiconductors with a large band gap are increasingly used, which include, for example, SiC-MOSFETs, SiC-JFETs as well as GaN-HEMTs.

Compared to SiC-MOSFETs, SiC-JFETs offer lower conduction losses and a simpler manufacturing process, however, they are not self-locking. To be able to ensure a functional safety, for example, in the field of electric mobility and to be able to use self-locking power components with SiC-JFETs, it is conventional to use a cascode circuit, in which an SiC-JFET is connected in series to an Si-MOSFET. In this case, a gate terminal of the JFET is connected to a source terminal of the MOSFET.

Such a circuit arrangement results in a self-locking component with a long short-circuit time.

SUMMARY

According to one aspect of the present invention, a cascode arrangement is provided, which includes a substrate, a self-conducting semiconductor switch, a MOSFET and at least one sensor system. The MOSFET is designed preferably as a low-voltage MOSFET, without thereby being limited to such a variant.

According to an example embodiment of the present invention, to form the cascode arrangement, a drain terminal of the MOSFET is electrically connected to a source terminal of the self-conducting semiconductor switch of the MOSFET and a source terminal of the MOSFET is electrically connected to a gate terminal of the self-conducting semiconductor switch. In this way, a self-locking characteristic of the cascode arrangement is achieved, as a result of which the cascode arrangement is also usable in safety-relevant fields of application, while at the same time advantages such as low conduction losses and a simplified manufacturing process are achievable.

The cascode arrangement according to an example embodiment of the present invention provides that a first semiconductor layer, in which the MOSFET is formed, and a second semiconductor layer, in which the self-conducting semiconductor switch is formed, and a connecting material is situated stacked on top of one another, both an electrical as well as a thermal coupling between the self-conducting semiconductor switch and the MOSFET being implemented via the connecting material. The connecting material also ensures a fixed connection between the first semiconductor layer and the second semiconductor layer.

In addition, according to an example embodiment of the present invention, the stacked semiconductor layers are fixedly situated on the substrate, the substrate being advantageously usable for dissipating heat generated by the cascode arrangement. For this purpose, the same connecting material, for example, is used, which is used for connecting the first semiconductor layer and the second semiconductor layer. Alternatively or in addition, a connecting material differing therefrom is also usable. The stack made up of the first semiconductor layer and the second semiconductor layer is advantageously attached on the substrate in such a way that the second semiconductor layer is situated between the first semiconductor layer and the substrate, a drain electrode (which is formed, for example, on the basis of a copper layer) being hereby advantageously situated between the second semiconductor layer and the substrate and being accessible for a contacting from the outside. In addition, it is also possible for the first semiconductor layer to be situated between the second semiconductor layer and the substrate. It is also possible that the stack made up of the first semiconductor layer and the second semiconductor layer is surrounded by a first substrate and by a second substrate.

In addition, according to an example embodiment of the present invention, the first semiconductor layer includes a first subarea, in which the MOSFET is formed, and it also includes at least one second subarea, in which the at least one sensor system is formed, the sensor system being preferably formed in the first semiconductor layer in an integrated manner.

Due to the local proximity and the type of arrangement of the two semiconductor layers, the sensor system is configured according to the present invention to detect at least one physical variable relating to the self-conducting semiconductor switch, and to provide a signal representing the physical variable. The signal generated by the sensor system may be provided, for example, via contact surfaces of the cascode arrangement to outside the cascode arrangement and/or for a use within the cascode arrangement. It should be noted that the physical variable detected by the sensor system may also be influenced by the operation of the MOSFET, the physical variable, however, being advantageously situated and/or formed in such a way that it is influenced largely by the self-conducting semiconductor switch.

In addition to the advantages of a conventional semiconductor cascode circuit made up of a MOSFET and a self-conducting semiconductor switch (for example, low conduction losses, low Miller effect, short-circuit current limitation due to negative feedback), the cascode arrangement according to the present invention may yield the particular advantage that the first semiconductor layer, which is particularly cost-efficiently manufacturable due to the minimum requirements for the performance of the MOSFET, is usable for detecting physical variables of the self-conducting semiconductor switch. In other words, for reasons of space and/or for manufacturing reasons, a sensor system is generally much more easily and/or more cost-efficiently integratable into the first semiconductor layer than into the SiC-based second semiconductor layer.

In addition, the cascode arrangement according to an example embodiment of the present invention may yield an advantage that as a result of the direct integration of a sensor system into the cascode arrangement, higher-level components (for example, semiconductor modules), which may include, in particular, a plurality of cascode arrangements according to the present invention, are allowed to monitor each cascode arrangement per se with a high degree of accuracy, whereas in the related art a single sensor system is typically used for monitoring a plurality of cascode arrangements (for example, a single temperature sensor for a semiconductor module).

Preferred refinements of the present invention are disclosed herein.

In one advantageous example embodiment of the present invention, the self-conducting semiconductor switch is a JFET and particularly preferably an SiC-JFET and/or an HEMT and particularly preferably a GaN-HEMT. Alternatively or in addition, the MOSFET is an Si-MOSFET. Further alternatively or in addition, the connecting material is a sinter material and/or a solder.

A surface of the first semiconductor layer and a surface of the second semiconductor layer advantageously have an essentially identical size and or geometry. This does not explicitly rule out the possibility of respective surfaces of the first semiconductor layer and of the second semiconductor layer differing slightly from one another. For example, deviations between the surfaces in the range of up to 10% or more are possible. Using preferably identical sizes and/or geometries of the two semiconductor layers improves, for example, a reliability and/or a mechanical stability and/or a current carrying capacity of the cascode arrangement. Since a load of the MOSFET in the cascode arrangement is less than a load in the self-conducting semiconductor switch, a smaller surface is generally required for the formation of the MOSFET than for the formation of the self-conducting semiconductor switch. If the first semiconductor layer forming the MOSFET is now designed with a dimensioning similar to the second semiconductor layer, it is possible to utilize the surface in the first semiconductor layer, not required in this case for forming the MOSFET, correspondingly for the integration of the sensor system and/or of further components described below integratable into the first semiconductor layer, without having to thereby limit a required efficiency of the MOSFET. In addition, it is possible as a result to also forgo an Rdson*A optimization up to and including a technological minimum. The respective surfaces are essentially stacked on top of one another in a completely overlapping manner in order, for example, to achieve an optimal thermal and/or electrical contact-connection. In addition, it is advantageously possible for the second semiconductor layer to include an edge structure extending beyond the first semiconductor layer (in particular, uniformly to all sides), which is usable, in particular, for reducing a potentially high drain potential.

The at least one physical variable is, for example, a temperature and/or a voltage and/or a current of the self-conducting semiconductor switch. The temperature may be detected, for example, with the aid of an Si-diode, which is formed in a subarea of the first semiconductor layer differing from the first subarea of the first semiconductor layer (for example, in the second subarea). Alternatively or in addition, the temperature may be detected with the aid of a current source, which outputs a temperature-dependent current ("proportional to absolute temperature" current source) and/or with the aid of an NTC and/or with the aid of a poly-diode and/or with the aid of a sensor system differing therefrom. A load current of the cascode arrangement may be detected, for example, with the aid of a current mirror, which is integrated into the first semiconductor layer, the current mirror as the current source outputting a fraction of the current in the load path. A geometric factor of 1:1000, for example, is suitable in this case. Thus, in an exemplary operating range of up to 120 A, this results in a measuring current of 120 mA.

In one particularly advantageous example embodiment of the present invention, an actuating system is situated within the second subarea and/or within one or multiple further subareas of the first semiconductor layer. A suitable actuating system is, among other things, a gate driver which, due to the integration into the cascode arrangement, is able to reduce, among other things, parasitic effects on a switching operation and/or to provide a low gate inductivity and/or to simplify or eliminate an electronic packaging (abbreviated EP). Alternatively or in addition, it is possible to form a logic circuit and, in particular, an activation circuit for the gate driver and/or one or multiple contact surfaces ("pads") within the second subarea and/or within one or multiple further subareas of the first semiconductor layer. A voltage is supplied for example, via the contact surfaces to the gate driver and/or to the activation circuit. Alternatively or in addition, it is possible to provide contact surfaces for feeding a control signal for activating the cascode arrangement and/or for a communication interface between the cascode arrangement and surroundings of the cascode arrangement and/or for other purposes.

According to an example embodiment of the present invention, the cascode arrangement further advantageously includes a push/pull stage integrated into the first semiconductor layer, which is integrated, for example, into a gate driver also integrated into the first semiconductor layer and/or into the first semiconductor layer separately from such a gate driver. The push/pull stage yields the advantage that, for example, a gate driver coupled herewith is activatable without power and, as a result, the gate driver is directly activatable by a microcontroller etc. situated apart from the cascode arrangement. Alternatively or in addition, it is possible for a Miller Clamp Transistor for preventing a parasitic reactivation of the self-conducting semiconductor switch and/or a protection circuit (for example, for recognizing a short-circuit and/or for handling a short-circuit and/or for an ESD (electrostatic discharge) protection, etc.) and/or a communication interface to be advantageously integrated into the first semiconductor layer. The communication interface is designed, for example, as a PWM (pulse width modulation) interface, which is usable for, among other things, activating the cascode arrangement and/or as a UART interface (for example, for providing measuring signals of a respective sensor system of the first semiconductor layer).

In one further advantageous example embodiment of the present invention, the logic circuit is configured to ascertain deviations of the at least one physical variable from a predefined setpoint value range and/or to carry out calculations on the basis of the signal (for example, in order to derive a thermal resistance on the basis of a detected current value and of a voltage value) and/or to activate the MOSFET as a function of the signal generated by the sensor system (for example, in order to adapt a switching behavior as a function of a measured temperature and/or of a measured current, or in order to use operating point-dependent gate current profiles) and/or to match tolerances of switching characteristics of the MOSFET and of the self-conducting semiconductor switch to one another. The latter may be implemented, for example, on the basis of an End-of-Line calibration in the course of the manufacturing of the cascode arrangement by taking tolerance values ascertained during the calibration into account when activating the cascode arrangement.

The source terminal of the MOSFET is preferably connected via a resistor to the gate terminal of the self-conducting semiconductor switch, which is designed, in particular, as a temperature-compensated gate resistor (i.e., which exhibits essentially no temperature variations). Alternatively or in addition, a sensor system and/or an actuator system and/or a logic circuit is/are also provided in the second semiconductor layer.

In one further advantageous embodiment of the present invention, the signal is an initial signal and the sensor system is configured to detect at least one physical variable of the MOSFET and to provide a second signal representing the physical variable.

According to a second aspect of the present invention, a semiconductor module is provided, which includes a plurality of cascode arrangements as disclosed herein. The semiconductor module is, for example, a power semiconductor module, which is used in an inverter, the inverter being provided, for example, for a drive train of an electrically driven vehicle, without thereby limiting the semiconductor module to such an application. The semiconductor module advantageously includes an evaluation unit, which is electrically connected to the individual cascode arrangements, so that the evaluation unit is configured, for example, to carry out separate or independent monitoring (for example, temperature monitoring, switching state monitoring, etc.) for the individual cascode arrangements.

BRIEF DESCRIPTION OF THE DRAWINGS

Exemplary embodiments of the present invention are described in detail below with reference to the figures.

DETAILED DESCRIPTION OF EXAMPLE EMBODIMENTS

Figure 1:
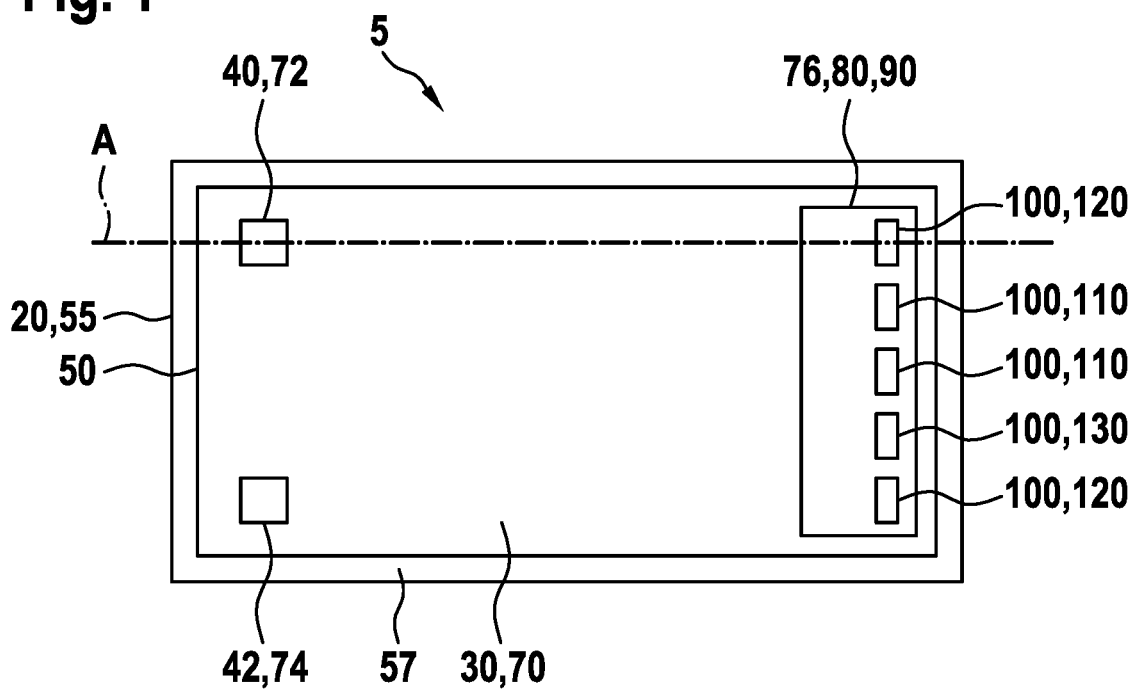
FIG. 1 schematically shows a top view of one specific example embodiment of a cascode arrangement according to the present invention.

FIG. 1 schematically shows a top view of one specific embodiment of a cascode arrangement 5 according to the present invention.

Figure 2:
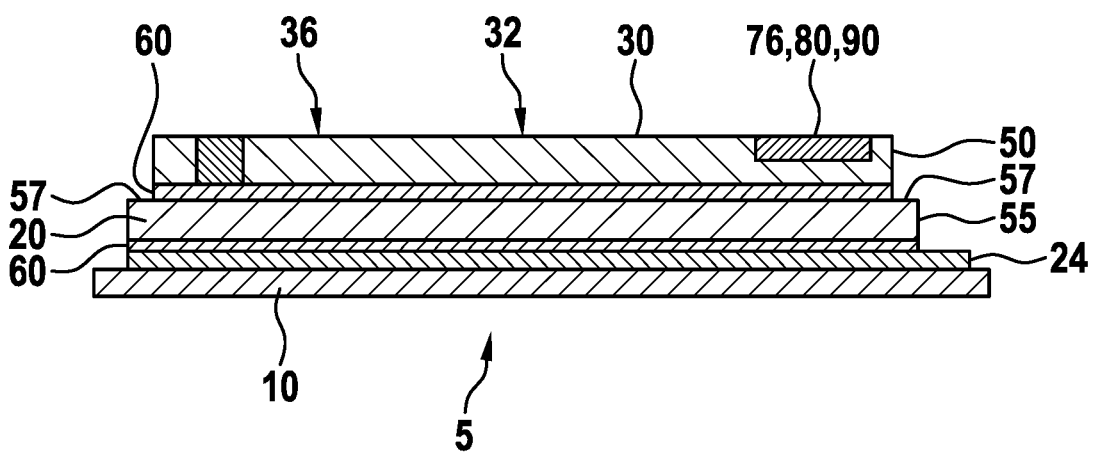
FIG. 2 schematically shows a cross-sectional view of the cascode arrangement shown in FIG. 1 in connection with a substrate and a drain terminal.
Figure 3:
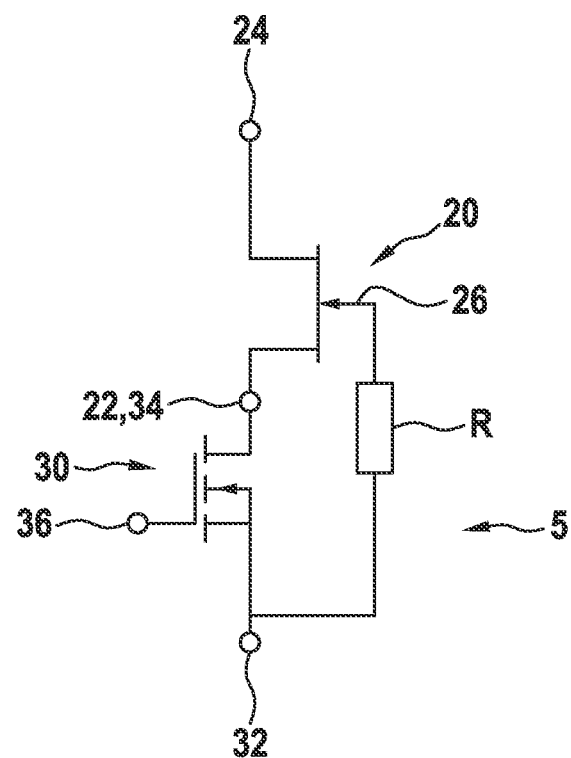
FIG. 3 shows a circuit diagram of an exemplary cascode circuit according to the present invention.

Cascode arrangement 5 includes a first semiconductor layer 50 and a second semiconductor layer 55, an Si-MOSFET 30 being formed in a first subarea 70 of first semiconductor layer 50, whereas an SiC-JFET 20 is formed in second semiconductor layer First semiconductor layer 50 is thermally, electrically and fixedly connected to second semiconductor layer 55 via a connecting material 60 shown in FIG. 2, which in this case is a sinter material. The electrical connection is formed in such a way that Si-MOSFET 30 and SiC-JFET 20 are interconnected as shown in FIG. 3. Second semiconductor layer 55 extends beyond first semiconductor layer 50 in this case evenly via an edge structure 57 of second semiconductor layer 55.

In a second subarea 72 of first semiconductor layer 50, cascode arrangement 5 according to the present invention also includes a temperature sensor 40, which is designed here as a diode and which is configured to detect a temperature of SiC-JFET 20 on the basis of the thermal coupling between layers 50, 55.

In a third subarea 74 of first semiconductor layer 50, cascode arrangement 5 according to the present invention further includes a current sensor 42, which is designed on the basis of a current mirror.

In addition, an actuator system 80 in the form of a gate driver for Si-MOSFET 30 is formed in a fourth subarea 76 of first semiconductor layer 50. Furthermore, a logic circuit 90 configured to, among other things, receive an initial signal from temperature sensor 40 and a second signal from current sensor 42, to process the signals and to provide a result of the processing via a UART communication interface 110 is situated in fourth subarea 76, the communication interface 110 being formed by respective contact surfaces 100, which are also situated in fourth subarea 76 of first semiconductor layer 50.

Furthermore, two contact surfaces 100 are situated in fourth subarea 76, via which a supply of voltage 120 to logic circuit and to actuator system 80 designed as a gate driver takes place.

Cascode arrangement 5 is configured to receive an external PWM signal for activating the gate driver via a further contact surface 100 situated in fourth subarea 76, which serves as PWM interface 130.

FIG. 2 schematically shows a cross-sectional view of cascode arrangement 5 shown in FIG. 1 in connection with a substrate and a drain terminal 24, the cross section being seen along line A shown in FIG. 1.

It should be noted that to avoid repetitions, only those elements are described in FIG. 2 that are not shown in FIG. 1.

Second semiconductor layer 55 is electrically connected to a drain electrode 24 of SiC-JFET 20 with the aid of connecting material 60 shown in FIG. 1, drain electrode 24 being attached at a substrate 10 of cascode arrangement 5.

FIG. 3 shows a circuit diagram of an exemplary cascode circuit, which facilitates understanding of the present invention.

An Si-MOSFET 30 of the cascode arrangement is connected to a source terminal 22 of a SiC-JFET 20 via a drain terminal 34 of Si-MOSFET 30.

A source terminal 32 of Si-MOSFET 30 is connected to a gate terminal 26 of SiC-JFET 20 via a resistor R.

In this way, the cascode circuit is configured to control a load current between a source terminal 32 of Si-MOSFET 30 and a drain terminal 24 of SiC-JFET 20 with the aid of an activation via a gate terminal 36 of Si-MOSFET 30.

Figure 4:
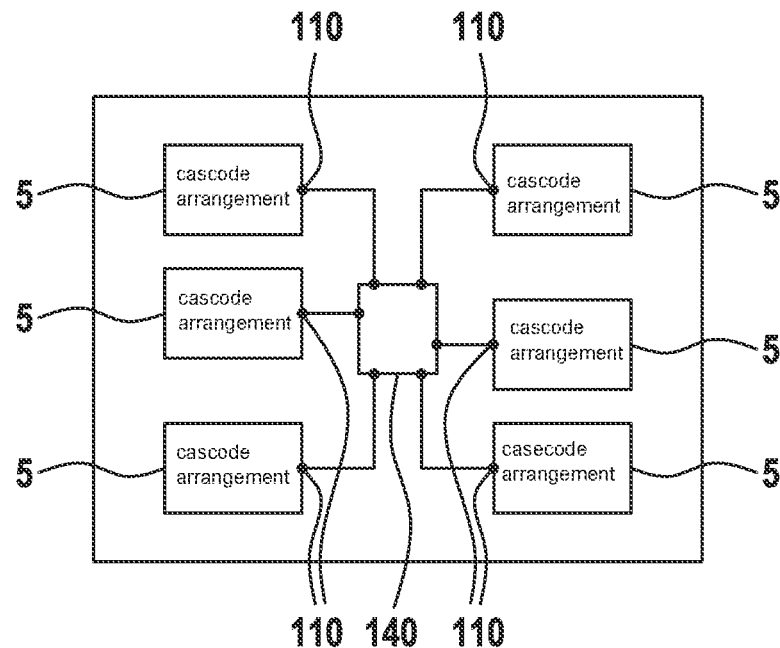
FIG. 4 schematically shows a view of one specific example embodiment of a semiconductor module according to the present invention.

FIG. 4 schematically shows a view of one specific embodiment of a semiconductor module according to the present invention, the semiconductor module in this case including six cascode arrangements 5 according to the present invention, which are configured to transfer measuring signals of a respective sensor system (not shown) to a higher-level evaluation unit 140 via respective communication interfaces 110.

Evaluation unit 140 is configured to monitor respective states of the six cascode arrangements 5 on the basis of the measuring signals.

What is claimed is:

1. A cascode arrangement, comprising:
   a substrate;
   a self-conducting semiconductor switch;
   a MOSFET; and
   at least one sensor system;
   wherein:
   a drain terminal of the MOSFET is electrically connected to a source terminal of the self-conducting semiconductor switch, and a source terminal of the MOSFET is electrically connected to a gate terminal of the self-conducting semiconductor switch,
   a first semiconductor layer in which the MOSFET is formed, and a second semiconductor layer in which the self-conducting semiconductor switch is formed, are situated stacked on top of one another via a connecting material, both an electrical and a thermal coupling between the self-conducting semiconductor switch and the MOSFET being implemented via the connecting material,
   the stacked semiconductor layers are situated on the substrate,
   the first semiconductor layer includes a first subarea in which the MOSFET is formed, and includes at least one second subarea in which the at least one sensor system is formed, and
   the sensor system is configured to detect at least one physical variable relating to the self-conducting semiconductor switch, and to provide a signal representing the physical variable.

2. The cascode arrangement as recited in claim 1, wherein:
   (i) the self-conducting semiconductor switch is an SiC-JFET and/or a GaN-HEMT, and/or
   (ii) the MOSFET is an Si-MOSFET, and/or
   (iii) the connecting material is a sinter material and/or a solder.

3. The cascode arrangement as recited in claim 1, wherein:
   (i) a surface of the first semiconductor layer and a surface of the second semiconductor layer have an essentially identical size and/or geometry, and/or
   (ii) the surface of the first semiconductor layer and the surface of the second semiconductor layer s are stacked on top of one another in an essentially completely overlapping manner, and/or
   (iii) the second semiconductor layer includes an edge structure extending beyond the first semiconductor layer.

4. The cascode arrangement as recited in claim 1, wherein the at least one physical variable includes:
   a temperature, and/or
   a voltage, and/or
   a current.

5. The cascode arrangement as recited in claim 1, wherein, within the second subarea and/or withing further subareas of the semiconductor layer, the following is formed:
   an actuator system including a gate driver, and/or
   a logic circuit including an activation circuit for the gate driver, and/or
   a contact surface.

6. The cascode arrangement as recited in claim 1, wherein the following is integrated into the cascode arrangement:
   a push/pull stage, and/or
   a Miller Clamp Transistor for preventing a parasitic reactivation of the self-conducting semiconductor switch, and/or
   a protective circuit, and/or
   a communication interface.

7. The cascode arrangement as recited in claim 1, wherein the logic circuit is configured to:
   ascertain deviations of the at least one physical variable from a predefined setpoint value range, and/or
   carry out calculations based on the signal, and/or
   activate the MOSFET as a function of the signal generated by the sensor system, and/or
   match tolerances of circuit characteristics of the MOSFET and of the self-conducting semiconductor switch to one another.

8. The cascode arrangement as recited in claim 1, wherein:
   i) the source terminal of the MOSFET is connected via a resistor to the gate terminal of the self-conducting semiconductor switch, the resistor being a temperature-compensated gate resistor, and/or
   ii) a sensor system and/or an actuator system and/or a logic circuit is additionally provided in the second semiconductor layer.

9. The cascode arrangement as recited in claim 1, wherein:
   the signal is an initial signal, and
   the sensor system is configured to detect at least one physical variable of the MOSFET and to provide a second signal representing the physical variable.

10. A semiconductor module, comprising:
    a plurality of cascode arrangements, each including:
    a substrate,
    a self-conducting semiconductor switch,
    a MOSFET, and
    at least one sensor system;
    wherein:
    a drain terminal of the MOSFET is electrically connected to a source terminal of the self-conducting semiconductor switch, and a source terminal of the MOSFET is electrically connected to a gate terminal of the self-conducting semiconductor switch,
    a first semiconductor layer in which the MOSFET is formed, and a second semiconductor layer in which the self-conducting semiconductor switch is formed, are situated stacked on top of one another via a connecting material, both an electrical and a thermal coupling between the self-conducting semiconductor switch and the MOSFET being implemented via the connecting material,
    the stacked semiconductor layers are situated on the substrate,
    the first semiconductor layer includes a first subarea in which the MOSFET is formed, and includes at least one second subarea in which the at least one sensor system is formed, and
    the sensor system is configured to detect at least one physical variable relating to the self-conducting semiconductor switch, and to provide a signal representing the physical variable.

* * * * *